(12) United States Patent
Ram

(10) Patent No.: US 9,405,479 B1
(45) Date of Patent: Aug. 2, 2016

(54) FASTER FILE COMPRESSION USING SLIDING COMPRESSION WINDOW AND BACKWARD COMPOUND POINTERS

(71) Applicant: Western Digital Technologies, Inc., Irvine, CA (US)

(72) Inventor: Tamir Ram, Sunnyvale, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 93 days.

(21) Appl. No.: 14/154,974

(22) Filed: Jan. 14, 2014

Related U.S. Application Data

(60) Provisional application No. 61/870,051, filed on Aug. 26, 2013.

(51) Int. Cl.
  *G06F 3/00* (2006.01)
  *G06F 3/06* (2006.01)

(52) U.S. Cl.
  CPC ............ *G06F 3/0619* (2013.01); *G06F 3/0667* (2013.01); *G06F 3/0689* (2013.01)

(58) Field of Classification Search
  None
  See application file for complete search history.

(56) References Cited

U.S. PATENT DOCUMENTS

| | | | |
|---|---|---|---|
| 5,446,888 A | 8/1995 | Pyne | |
| 5,574,906 A | 11/1996 | Morris | |
| 6,233,589 B1 | 5/2001 | Balcha et al. | |
| 6,499,054 B1 | 12/2002 | Hesselink et al. | |
| 6,732,158 B1 | 5/2004 | Hesselink et al. | |
| 6,738,779 B1 | 5/2004 | Shapira | |
| 7,120,692 B2 | 10/2006 | Hesselink et al. | |
| 7,454,443 B2 | 11/2008 | Ram et al. | |
| 7,467,187 B2 | 12/2008 | Hesselink et al. | |
| 7,546,353 B2 | 6/2009 | Hesselink et al. | |
| 7,587,467 B2 | 9/2009 | Hesselink et al. | |
| 7,600,036 B2 | 10/2009 | Hesselink et al. | |
| 7,788,404 B2 | 8/2010 | Hesselink et al. | |
| 7,917,628 B2 | 3/2011 | Hesselink et al. | |
| 7,934,251 B2 | 4/2011 | Hesselink et al. | |
| 7,949,564 B1 | 5/2011 | Hughes et al. | |
| 8,004,791 B2 | 8/2011 | Szeremeta et al. | |
| 8,171,063 B1 * | 5/2012 | Janakiraman et al. | 707/822 |
| 8,255,661 B2 | 8/2012 | Karr et al. | |
| 8,275,755 B2 | 9/2012 | Hirsch et al. | |
| 8,285,965 B2 | 10/2012 | Karr et al. | |
| 8,341,117 B2 | 12/2012 | Ram et al. | |
| 8,341,275 B1 | 12/2012 | Hesselink et al. | |
| 8,352,567 B2 | 1/2013 | Hesselink et al. | |
| 8,526,798 B2 | 9/2013 | Hesselink | |
| 8,631,284 B2 | 1/2014 | Stevens | |
| 8,646,054 B1 | 2/2014 | Karr et al. | |
| 8,661,507 B1 | 2/2014 | Hesselink et al. | |
| 8,688,797 B2 | 4/2014 | Hesselink et al. | |

(Continued)

*Primary Examiner* — Kevin Verbrugge
*Assistant Examiner* — Craig Goldschmidt

(57) ABSTRACT

A method may comprise reading a portion of a predetermined amount of data; identifying a first location, within the portion of the predetermined amount of data, of each instance of a data value; identifying second and subsequent locations, within the portion of the predetermined amount of data, of each instance of the data values of the read portion of the predetermined amount of data; determining separate instances of repeated sequences of values in the identified locations; and compressing at least one of the determined separate instances of repeated sequences of values. The compression may be carried out by replacing each repeated sequence of values with at least a reference to a previous instance of the repeated sequence and a length of the previous repeated sequence.

21 Claims, 3 Drawing Sheets

(56) References Cited

U.S. PATENT DOCUMENTS

| | | |
|---|---|---|
| 8,713,265 B1 | 4/2014 | Rutledge |
| 8,762,682 B1 | 6/2014 | Stevens |
| 8,780,004 B1 | 7/2014 | Chin |
| 8,793,374 B2 | 7/2014 | Hesselink et al. |
| 8,819,443 B2 | 8/2014 | Lin |
| 2001/0037323 A1 | 11/2001 | Moulton et al. |
| 2003/0167275 A1 | 9/2003 | Rjaibi |
| 2005/0144195 A1 | 6/2005 | Hesselink et al. |
| 2005/0144200 A1 | 6/2005 | Hesselink et al. |
| 2008/0016131 A1* | 1/2008 | Sandorfi et al. ............... 707/204 |
| 2009/0228455 A1 | 9/2009 | Hirsch et al. |
| 2009/0228456 A1 | 9/2009 | Hirsch et al. |
| 2009/0228534 A1 | 9/2009 | Hirsch et al. |
| 2009/0234855 A1 | 9/2009 | Hirsch et al. |
| 2009/0271402 A1* | 10/2009 | Srinivasan .......... G06F 17/3015 |
| 2009/0300301 A1* | 12/2009 | Vaghani ....................... 711/162 |
| 2011/0099154 A1* | 4/2011 | Maydew et al. .............. 707/692 |
| 2012/0036041 A1 | 2/2012 | Hesselink |
| 2013/0086353 A1* | 4/2013 | Colgrove et al. ............. 711/206 |
| 2013/0179647 A1* | 7/2013 | Park .................... G06F 12/0238 711/154 |
| 2013/0212401 A1 | 8/2013 | Lin |
| 2013/0266137 A1 | 10/2013 | Blankenbeckler et al. |
| 2013/0268749 A1 | 10/2013 | Blankenbeckler et al. |
| 2013/0268759 A1 | 10/2013 | Blankenbeckler et al. |
| 2013/0268771 A1 | 10/2013 | Blankenbeckler et al. |
| 2014/0095439 A1 | 4/2014 | Ram |
| 2014/0169921 A1 | 6/2014 | Carey |
| 2014/0173215 A1 | 6/2014 | Lin et al. |

* cited by examiner

FASTER FILE COMPRESSION USING SLIDING COMPRESSION WINDOW AND BACKWARD COMPOUND POINTERS

CROSS-REFERENCE TO RELATED APPLICATIONS

This application claims benefit of U.S. Provisional Patent Application Ser. No. 61/870,051 entitled "FASTER FILE COMPRESSION USING SLIDING COMPRESSION WINDOW AND BACKWARD COMPOUND POINTERS" filed Aug. 26, 2013, the disclosure of which is incorporated by reference herein in its entirety.

BACKGROUND

Compression may be carried out to increase the amount of data that may be stored on a data storage device. Unlike movies, pictures or audio recording that may support lossy compression, user data must be retrievable in the same condition as it was stored. This means lossless compression. For many applications that are not particularly time-sensitive, a high degree of compression may be achieved, albeit at the expense of processing cycles, storage resources and time. For other applications, a faster compression is more important than a slower compression that may be somewhat better.

DETAILED DESCRIPTION

An embodiment defines a method of compressing data that, although not as efficient as some other compression methods, is faster and may be preferred in many applications. This may be termed "good enough" compression. What it lacks in efficiency, it gains in speed.

According to one embodiment, backward compound pointers are used to reference repeated byte pairs. Such pointers may be stored in a reverse pointer buffer during compression. This data structure comprises pointers to previous instances of repeated data and to previous matches. For example, bytes of the data may be examined using a sliding window of width, for example, of two bytes. The window, for example, may be configured to slide across the data in one-byte increments.

This method assumes that bytes pairs that match previous byte pairs are likely to repeat again in the future (further down the data). In one embodiment, a sliding compression window is used. According to one embodiment, the window is two bytes in width, although windows of other widths may be used.

According to one embodiment, a table of all possible two bytes values is created and a pointer may be provided to all the locations where these two bytes values are used. Once a primary string (a string that is to be reduced in size by finding a match in the buffer) is encountered that starts with these two bytes values, the table may be consulted and each string may be examined that starts with these two bytes and compared to the primary string.

Figure 1:
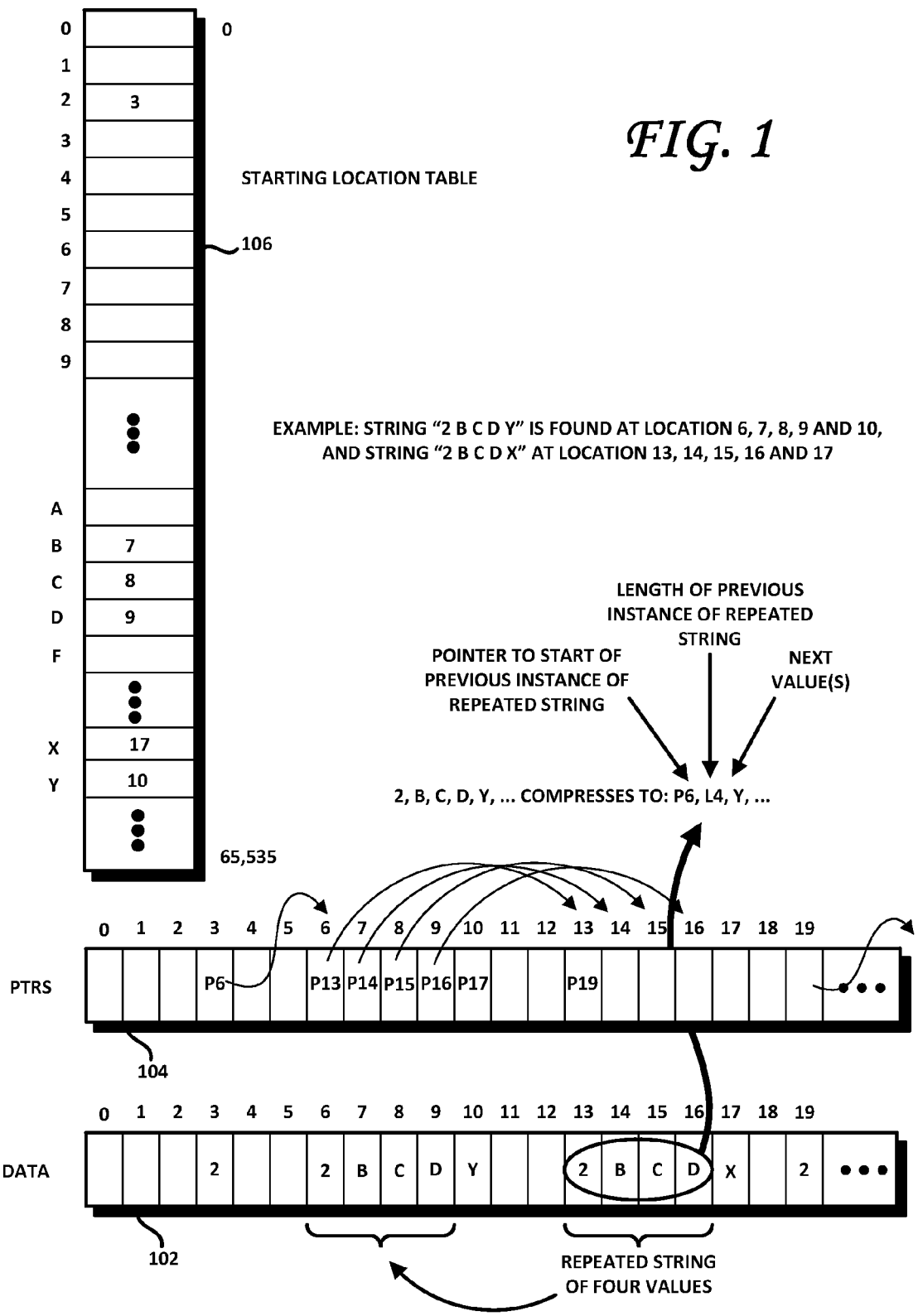
FIG. 1 is a block diagram illustrating aspects of one embodiment.

FIG. 1 is a block diagram illustrating aspect of one embodiment. As shown therein, sample data to be compressed according to one embodiment is shown at 102. For example, data may be compressed in, for example, 1 MB chunks. Therefore, data 102 may be, for example, 1 MB of data. As shown, the data 102 may comprise, for purposes of illustration, the value "2" at location 3, 6, 13 and 19. According to one embodiment, to track these repeated values in the data 102, a pointers table 104 may be used. According to one embodiment, the pointers table 104 may be the same size as the data being processed; namely, 1 MB in this example. According to one embodiment, the data stored in the pointers table 104 is only used during the compression of the current data chunk 102. When the data chunk 102 is fully processed and compressed according to one embodiment, the next chunk of, for example, 1 MB may be examined, a new pointers 104 table allocated or the current contents of the pointers table 104 erased. The pointers table 104 may then be populated according to the 1 MB chunk of data currently being compressed.

Table 106 may be called a starting location table. The starting location table 106 may be configured to store, according to one embodiment, the first instance of all possible values within a given byte length. In the example of FIG. 1, that length is 2 bytes, and the starting location table 106 comprises $2^{16}$ or 65,536 rows. According to one embodiment, the pointers table 104 may be populated with linked lists of pointers. For example, the first instance of a given value may be located using the starting location table 106, whereupon subsequent instances of the given value may be located using a linked list of pointers in the pointers table 104. According to one embodiment, these tables 104, 106 may then be used during the compression of the data 102.

In the example of FIG. 1, the first instance of the value "2" is at location 3 in the data 102. Therefore, a "3" is entered in starting location table 106, which may be indexed by values of the data. In this manner, the "3" entered at offset "2" in the starting location table 106, indicates that the value "2" may be found at location "3" in the data 102. Next, examination of the sample data 102 reveals that the next instance of the value "2" is at location 6 in the data 102. Therefore, a pointer "P6" may be entered in the pointers table 104, at the location 3 indicated by the starting location table 106 at offset 2, which indicates that the next instance of value "2" in the data 102 is at location 6. Thereafter, the next instance of the value "2" in the sample data 102 is at location 13. Therefore, a pointer P13 is entered at location 6. This process may be continued until all values of "2" in the data 102 are accounted for. In this manner, it may be seen that the first instance of the value "2" in the data 102 is at location 3, as shown in the starting location table 106. The next subsequent instances (if any) of the value "2" may then be found by consulting the pointers table 104, indexed by location. Therefore, the pointer P6 to the next instance of the value "2" in the data 102 may be found at the location 3. The pointers in the pointers table 104, therefore, indicate the next location at which the value in question is located. Therefore, a pointer P13 at location 6 indicates that the next instance of the value of "2" in the data 102 may be found at location 13 and the next instance at location 19, as indicated by pointer P19 at location 13.

As shown in FIG. 1, the data table 102 contains, in addition to the sample data value "2" at locations 6 and 13 detailed above, sample data value "B" at locations 7 and 14, sample data value "C" at locations 8 and 15, sample data value "C" at locations 8 and 15. Sample data value "Y" is found at location 10 and sample data value "X" is found at location 17. Therefore, the string "2 B C D Y" may be found in the data table 102 at locations 6, 7, 8 9, and 10 and the string "2 B C D X" may be found in the data table 102 at locations 13, 14, 15, 16 and 17. The staring location table 106, therefore, may be populated with starting location values 7, 8 and 9 for the values "B", "C" and "D", respectively. The pointers table 104, therefore, includes values of P14 at location 7, indicated at offset "B" in the starting location table 106. Similarly, the pointers table 104 includes values of P15 at location 8, indicated at offset "C" in the starting location table 106. Continuing, the pointers table 104 includes values of P16 at location 9, as indicated at offset "D" in the starting location table 106. As the string "2 B C D" is found both at locations 6, 7, 8 and 9 and at locations 13, 14, 15 and 16, there is an opportunity for compression, to avoid repeating the same string at two locations.

According to one embodiment, using the starting location table 106 and the pointers table 104, the values of the string "2 B C D X" may be replaced by a pointer to the first instance of the beginning of the string, and a length of the string that is repeated. Here, only the values "2 B C D" of the string "2 B C D X" are repeated, as the value "X" does not follow the first instance of the string "2 B C D" at locations 6, 7, 8 and 9. In this case, therefore, the repeated string "2 B C D" at locations 13, 14, 15 and 16 may be replaced by "P6, 4", indicating that the next 4 values may be found at the four consecutive locations beginning at location 6. Since the "X" value of the string "2 B C D X" is not repeated in the string "2 B C D Y", the value "X" is simply appended to the expression "P6, 4" indicative of the repeated string. In this manner and according to one embodiment, the repeated string "2 B C D X" at locations 13, 14, 15, 16 and 17 may be replaced with the compressed string "P6, 4, X".

According to one embodiment, in comparing strings, once a repeated byte is found, bytes pairs may be compared until the byte pairs no longer match. For example, having identified that the value "2" is present in location 6 and repeated at location 13, the byte pair at locations 7 and 14 may be compared. If a match is found, byte pair at locations 8 and 15 may be compared, and so on until byte pair 10 and 17 are compared and found not to match. Having identified a non-matching byte pair, the preceding matching bytes, if sufficient in number, may be compressed as detailed above and shown relative to FIG. 1. According to one embodiment, this two-byte sliding window may be replaced with a three-byte sliding window or a window of most any selected width.

According to one embodiment, an antecedent step may be carried out to determine whether the original, non-compressed data is deemed to be compressible or deemed to be sufficiently compressible so as to make the compression effort worthwhile. There are many different methods of determining whether data is compressible and any such methods may be utilized within the context of the present disclosure.

Moreover, according to one embodiment, a determination may be made whether the repeated string has a predetermined minimum length. For example, the exemplary string "2 B C D" is 4 bytes long, whereas the compressed version thereof; namely, "P6, 4" is two bytes long. It may not be useful or a judicious use of computing resources to compress any repeated string of less than, for example, 3 bytes in length. This minimum repeated length threshold may be set as desired. A larger threshold may result in a somewhat decreased compression ratio, but such compression may be carried out somewhat faster. Conversely, a smaller repeated length threshold may yield somewhat better compression, at the cost of a somewhat greater utilization of time and resources.

According to one embodiment, the repeated sequences of values may be determined across the entire chunk of data 102 being processed. In the example developed above, the chunk of data 102 was 1 MB in size. According to one embodiment, however, sequences of values may be considered to be "repeated" only if instances thereof appear within a predetermined span of data that is smaller than the size of the chunk of data 102 under current consideration. Such predetermined span may be, for example, 4 KB in length, 8 KB in length or most any length up to the size of the chunk of data 102 under consideration. In this manner, instances of values that would otherwise be identified as being "repeated" may not be so identified if they are more than the predetermined span away from the starting location of the sequence of values currently under consideration. Accordingly, a larger predetermined span (e.g., 500 KB or 1 MB) may achieve a better compression ratio (i.e., the large size of the span may capture more "repeats" of the sequences of values and/or longer repeated sequences) than a comparatively smaller predetermined span. However, such better compression ratio may be associated with increased use of processing and memory resources, which may lead to increased processing time. Similarly, a smaller predetermined span (e.g., 4 KB or 8 KB) may utilize comparatively fewer computational and memory resources (and thus may achieve somewhat better performance). A smaller span may be associated with a comparatively lesser compression ratio (i.e., the smaller size of the span may cause fewer "repeats" of sequences of values to be identified and/or the size of the repeated sequences may be smaller), but may carry out that compression faster.

According to one embodiment, after all of the data in the table 102 is processed to populate the starting location table 106 and the pointers table 104 and the data in the data table 102 is compressed as detailed above, another chunk (e.g., 1 MB) of data may be acquired, and the values in the starting location table 106 and the pointers table 104 discarded. The same tables 106, 104 may then be re-populated with starting values and pointers, respectively. Alternatively, the staring location table 106 and the pointers table 104 may be discarded and a new starting location table 106 and a new pointers table 104 may be instantiated upon the analysis of the new chunk of data. Successive chunks of data may be analyzed and compressed until all of the data has thus been analyzed and compressed.

This process may be carried out rapidly. Although other forms of compression may yield a greater compression ratio, embodiments in this disclosure favor speed of compression over achieving the maximum compression ratio.

Figure 2:
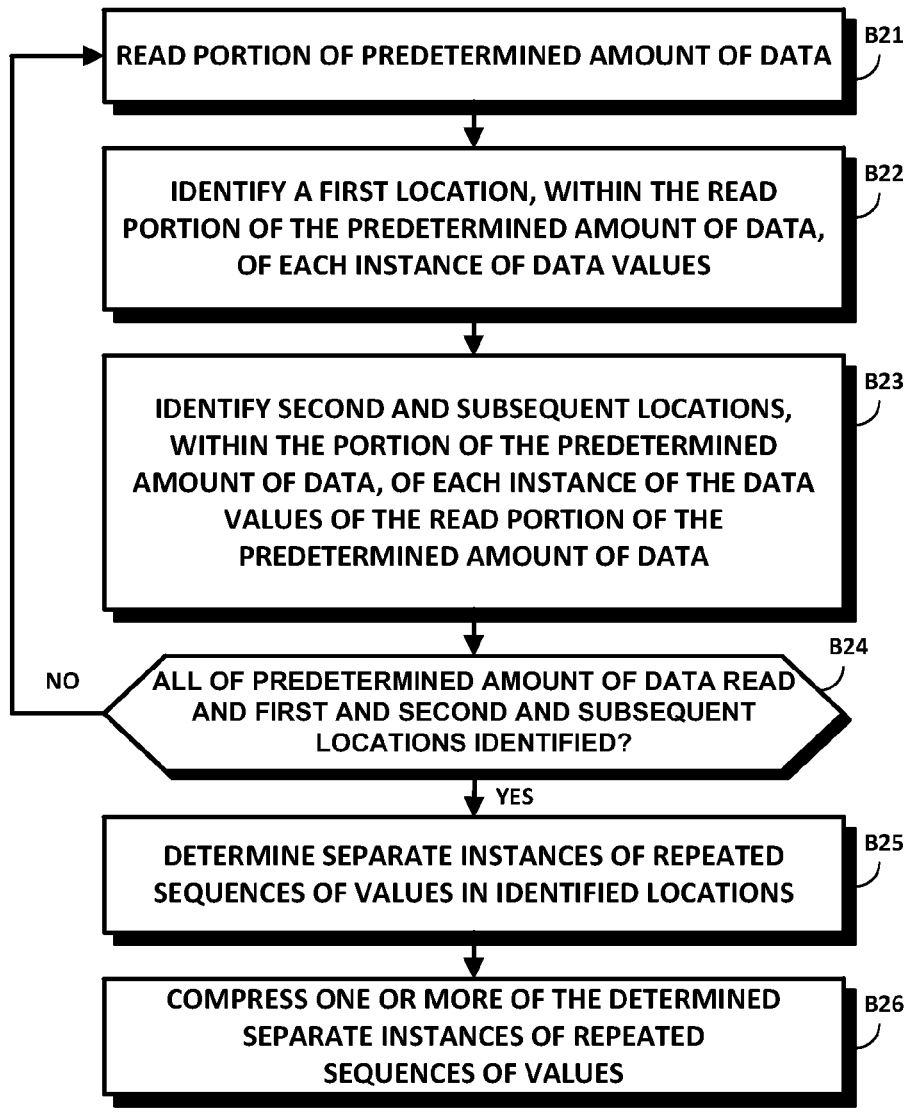
FIG. 2 is a flowchart of a method according to one embodiment.

FIG. 2 is a flowchart of a method according to one embodiment. As shown therein, block B21 calls for reading a portion of a predetermined amount of data. For example, the predetermined amount of data may be, for example, 1 MB of data, although other predetermined amounts may be used. Block B22 calls for identifying a first location, within the read portion of the predetermined amount of data, of each instance of data values. According to one embodiment, identifying the first location may comprise populating a starting location table (such as shown at 106 in FIG. 1) with the identified first location, within the read portion of the predetermined amount of data, of each instance of the data values. This results in the starting location table 106 being populated with the first location, within the read portion of the predetermined amount of data (and eventually within the entirety of the predetermined amount of data) of all of the data values contained therein. As shown at B23, second and subsequent locations may then be identified, within the predetermined amount of data), of each instance of the data values of the read portion of the predetermined amount of data. According to one embodiment, identifying the second and subsequent locations may comprise populating a reference table (such as shown at 104, for example), with a chain of references (e.g., pointers) to the identified second and subsequent locations. That is, within the read portion of the predetermined amount of data, first instances of data values may be stored in starting location table 106, and references (e.g., pointers) to subsequent instances thereof may be stored in reference table 104. This sequence may be repeated, as suggested at B24, until all data values of the predetermined amount of data has been processed and the starting location 106 table and the reference table 104 have been suitably populated.

Figure 3:
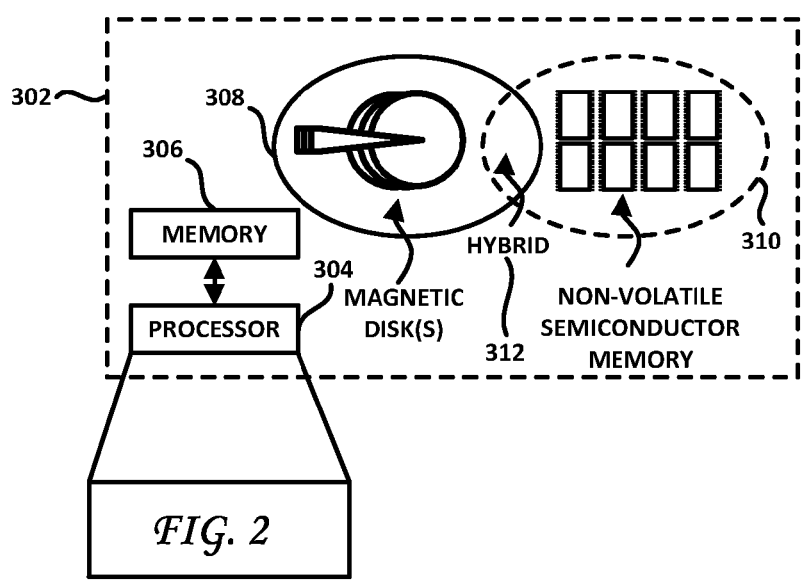
FIG. 3 is a block diagram of a device configured to carry out one embodiment.

When references (e.g., pointers) to the starting locations of all data values have populated the starting location table 106 and when references (e.g., pointers) to all second and subsequent instances of those data values have populated the reference table 104 (YES branch of B24), the separate instances of repeated sequences of values (such as the exemplary repeated sequence "2BCD" in FIG. 1) are determined from the identified locations, as shown at B25. According to one embodiment, the determined separate instances of repeated sequences of values are determined from the populated reference table. In the example developed in FIG. 1, the string "2BCD" is present beginning at locations 6 and 13. As shown at B26, one or more of the separate instances of repeated sequences of values may be compressed. For example, the second instance of a repeated sequence of values may be compressed down to a reference (e.g., pointer) to the next instance of the beginning of the repeated sequence of values, followed by a length of the repeated sequence, as shown in FIG. 3, in which the second instance of the sequence 2, B, C, D, Y is compressed to P6, 4, Y. It is to be noted that not all repeated sequences of values may be compressed if, for example, doing so would not achieve a predetermined compression ratio. Repeated sequences of values may remain uncompressed for other reasons. For example, it may be desired to trade a lesser expenditure of computational resources in favor of increased speed, or to seek to maximize compression at the cost of more processing load.

FIG. 3 is a block diagram of a device according to one embodiment. The device 302 may be or may comprise a computing device. According to one embodiment, the device 302 may comprise a Network Attached Storage (NAS) and/or a Direct Attached Storage DAS) device or a device comprising the same. The device 302 may comprise tangible, non-transitory storage comprising, for example, rotary media storage comprising magnetic disks 308, non-volatile semiconductor memory 310, or a hybrid 312 thereof, comprising both magnetic disks 308 and non-volatile semiconductor memory 310. The device 302 may also comprise volatile memory 306 and a processor (controller, microprocessor) 304. Processor 304 may be coupled to the memory 306, as well to the non-volatile memory or memories 308, 310 and 312. According to one embodiment, the processor 308 may be configured to execute sequences of instructions configured to carry out the functionality and methods shown and described relative to FIGS. 1 and 2. These sequences of instructions may be stored on the memory 306 and/or memories 308, 310 and 312.

While certain embodiments of the disclosure have been described, these embodiments have been presented by way of example only, and are not intended to limit the scope of the disclosure. Indeed, the novel methods, devices and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. For example, those skilled in the art will appreciate that in various embodiments, the actual physical and logical structures may differ from those shown in the figures. Depending on the embodiment, certain steps described in the example above may be removed, others may be added. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

The invention claimed is:

1. A method, comprising:
   reading a portion of a predetermined amount of data bounded by a sliding compression window;
   identifying a respective first location, within the portion of the predetermined amount of data, of a first occurrence of each respective one of a plurality of data values;
   identifying respective second and subsequent locations, within the portion of the predetermined amount of data, of each second and subsequent occurrence of each respective one of the plurality of values;
   determining separate instances of repeated sequences of values from the identified locations;
   compressing, using the identified respective first, second and subsequent locations, at least one of the determined separate instances of repeated sequences of values identified; and
   moving the sliding compression window to a next adjacent portion within the predetermined amount of data and returning to reading.

2. The method of claim 1, wherein compressing comprises compressing each of the determined separate instances of repeated sequences of values.

3. The method of claim 1, wherein compressing comprises replacing each repeated sequence of values with at least a reference to a previous instance of the repeated sequence and a length of the previous repeated sequence.

4. The method of claim 3, wherein the reference comprises a pointer to the previous instance of the repeated sequence.

5. The method of claim 1, further comprising, prior to compressing:
   determining whether a length of the at least one of the determined separate instances of repeated sequences of values is greater than a threshold length; and
   compressing only when the length is greater than the threshold length.

6. The method of claim 1, wherein identifying the first location comprises populating a starting location table with each identified occurrence of the data value and wherein identifying the second and subsequent locations comprises populating a reference table with a chain of references of each of the identified occurrences of the data values of the read portion of the predetermined amount of data.

7. The method of claim 6, further comprising continuing reading different portions of the predetermined amount of data, populating the starting location table and the reference table, determining and compressing for all of the predetermined amount of data.

8. The method of claim 6, wherein the chain of references comprises a linked list of references.

9. The method of claim 1, wherein compressing is lossless.

10. A device, comprising:
a memory; and
a processor coupled to the memory, the processor being configured to control storage and retrieval of data from a data storage device, the processor being further configured to:
read a portion of a predetermined amount of data bounded by a sliding compression window;
identify a respective first location, within the portion of the predetermined amount of data, of a first occurrence of each respective one of a plurality of data values;
identify respective second and subsequent locations, within the portion of the predetermined amount of data, of each second and subsequent occurrence of each respective one of the plurality of values;
determine separate instances of repeated sequences of values from the identified locations;
compress, using the identified respective first, second and subsequent locations, at least one of the determined separate instances of repeated sequences of values; and
move the sliding compression window to a next adjacent portion within the predetermined amount of data.

11. The device of claim 10, wherein the processor is further configured to compress each of the determined separate instances of repeated sequences of values.

12. The device of claim 10, wherein the processor is further configured to compress by replacing each repeated sequence of values with at least a reference to a previous instance of the repeated sequence and a length of the previous repeated sequence.

13. The device of claim 12, wherein the reference comprises a pointer to the previous instance of the repeated sequence.

14. The device of claim 10, wherein the processor is further configured to, prior to compressing:
determine whether a length of the at least one of the determined separate instances of repeated sequences of values is greater than a threshold length; and
compress only when the length is greater than the threshold length.

15. The device of claim 10, wherein the processor is further configured to:
populate a starting location table with each identified occurrence of the data value; and
populate a reference table with a chain of references of each of the identified occurrences of the data values of the read portion of the predetermined amount of data.

16. The device of claim 15, wherein the processor is further configured to continue reading different portions of the predetermined amount of data, populating the starting location table and the reference table, determining and compressing for all of the predetermined amount of data.

17. The device of claim 15, wherein the chain of references comprises a linked list of references.

18. The device of claim 10, wherein the processor is further configured to compress in a lossless manner.

19. The device of claim 10, wherein the device comprises a Network Attached Storage (NAS).

20. The device of claim 10, wherein the device comprises a Redundant Array of Independent Disks (RAID).

21. The device of claim 10, wherein the device comprises a disk drive.

* * * * *